United States Patent
Wu et al.

(10) Patent No.: US 7,105,375 B2
(45) Date of Patent: Sep. 12, 2006

(54) REVERSE PRINTING

(75) Inventors: Yiliang Wu, Ontario (CA); Nan-Xing Hu, Ontario (CA); Beng S. Ong, Ontario (CA)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 10/909,081

(22) Filed: Jul. 30, 2004

(65) Prior Publication Data

US 2006/0024859 A1     Feb. 2, 2006

(51) Int. Cl.
*H01L 51/40* (2006.01)
*H01L 21/336* (2006.01)
*H01L 21/8234* (2006.01)

(52) U.S. Cl. .......................... 438/99; 438/149; 438/197; 438/780; 438/782; 438/21; 438/109; 257/E21.255; 257/E21.582

(58) Field of Classification Search .................. 438/99, 438/21, 149, 780, 197, 782, 109; 257/40, 257/222, 72, E21.007, E51.005, E51.006, 257/E21.255, E21.582
See application file for complete search history.

(56) References Cited

U.S. PATENT DOCUMENTS

| | | |
|---|---|---|
| 5,079,595 A | 1/1992 | Suzuki et al. |
| 5,936,259 A | 8/1999 | Katz et al. |
| 5,946,551 A | 8/1999 | Dimitrakopoulos et al. |
| 5,981,970 A | 11/1999 | Dimitrakopoulos et al. |
| 6,194,837 B1 | 2/2001 | Ozawa |
| 6,265,243 B1 | 7/2001 | Katz et al. |
| 6,312,971 B1 | 11/2001 | Amundson et al. |
| 6,373,453 B1 | 4/2002 | Yudasaka |
| 6,403,397 B1 | 6/2002 | Katz |
| 6,498,114 B1 * | 12/2002 | Amundson et al. ......... 438/780 |
| 6,518,949 B1 | 2/2003 | Drzaic |
| 6,551,717 B1 | 4/2003 | Katz et al. |
| 6,603,141 B1 | 8/2003 | Lach et al. |
| 6,620,657 B1 | 9/2003 | Breen et al. |
| 6,716,371 B1 | 4/2004 | Sage et al. |
| 6,905,906 B1 * | 6/2005 | Sirringhaus et al. .......... 438/99 |
| 2003/0136958 A1 | 7/2003 | Beng Ong et al. |
| 2003/0160230 A1 | 8/2003 | Beng Ong et al. |
| 2003/0160234 A1 | 8/2003 | Beng Ong et al. |
| 2004/0119073 A1 * | 6/2004 | Ardakami et al. ............ 257/72 |
| 2005/0258417 A1 * | 11/2005 | Minakata ..................... 257/40 |

FOREIGN PATENT DOCUMENTS

| | | |
|---|---|---|
| JP | 07286117 | 10/1995 |
| JP | 03229435 | 8/2003 |

OTHER PUBLICATIONS

Paul, K.E. Appl. Phys. Lett. , 2003 vol. 83 pp. 2070-2072.
Dimitrakopoulos et al. "Organic Thin Film Transistors for Large Area Electronics" Adv. Mater., vol. 12, No. 2, pp. 99-117 (2002).
Licari, J. J at al. "Solvent-removable coatings fro electronic applications" ACS Symposium Series (1980), 132 (Resins Aerosp.) pp. 127-137.
Chabinyc, M. L. "Organic polymeric thin-film Transistors fabricated by selective dewetting" Appl. Phys. Lett. vol. 81. No. 22 (2002) pp. 4260-4262.
Booth, D. E et al., "Low Temperature adhesion bonding methods", Preceedings of the Third International Symposium on Semiconductor Wafer-Bonding: Physics and Applications 1995 pp. 201-211.

* cited by examiner

*Primary Examiner*—B. William Baumeister
*Assistant Examiner*—Igwe U. Anya
(74) *Attorney, Agent, or Firm*—Pillsbury Winthrop Shaw Pittman, LLP

(57) ABSTRACT

A method of patterning organic semiconductor layers of electronic devices utilizing reverse printing.

18 Claims, 2 Drawing Sheets

REVERSE PRINTING

STATEMENT REGARDING FEDERALLY SPONSORED RESEARCH OR DEVELOPMENT

This invention was made with United States Government support under Cooperative Agreement No. 70NAN-BOH3033 awarded by the National Institute of Standards and Technology (NIST). The United Stares Government has certain rights in this invention.

BACKGROUND

Disclosed is a process for forming thin film transistors (TFTs) in semiconductor devices. More specifically, illustrated herein is a method of reverse printing, which involves both deposition and patterning of organic semiconductor layers in thin film transistor devices.

Electronic components, including thin film transistors (TFTs) are commonly formed on silicon-based materials. However, semiconductor devices with organic active layers and printed electronic components are emerging as an inexpensive alternative to silicon-based devices. The performance of organic-based devices may not match the performance of their silicon-based counterparts in terms of device density and reliability under extreme conditions, for example, high or low temperatures. However, in certain applications, these shortcomings can be traded off for economic benefits because organic materials provide the advantage of producing these devices without the expensive steps associated with silicon processing. Other advantages of organic-based devices include the greater mechanical flexibility and easier electronic tunability.

Forming of patterned organic semiconductor layers, which includes deposition and patterning of organic semiconductor layers, is a significant part of TFT fabrication. The deposition method has significant effects on the physical properties of the resultant semiconductor layer such as the thickness, surface roughness, film morphology. These in turn have significant effect on the performance of TFTs. Patterning of semiconductor layers is also significant, as proper patterning and isolating the semiconductor layers into discrete areas may significantly reduce device leakage.

Formation of patterned organic semiconductor layers may be achieved by deposition of semiconductor layers with vacuum deposition, spin coating, dip coating, bar coating methods, followed by patterning with conventional photo-lithographic method. Other methods such as vacuum deposition through a shadow and lift-off patterning, controlling surface energy and spin or dip coating to generate patterned organic semiconductor layers have also been reported. However, these methods are generally multiple-step processes or complicated. They may not therefore be suitable for manufacturing low-cost, large-area devices. An example of the above-cited deposition and patterning methods to form a patterned organic semiconductor layer is disclosed by H. E. Katz in U.S. Pat. No. 6,403,397. The '397 process involves treating a surface to selectively provide regions of greater affinity and lesser affinity for an organic semiconductor solution. When the organic semiconductor, or solution comprising the semiconductor, is deposited on the treated surface, either the organic semiconductor or the organic semiconductor solution de-wets from the lesser affinity regions or the resultant film adheres only weakly to the lesser affinity regions such that selective removal is readily achieved.

Other references in the field include: C. D. Dimitrako-poulos, et al., U.S. Pat. No. 5,946,551; K. Amundson, et al., U.S. Pat. No. 6,312,971; Suzuki, et al., U.S. Pat. No. 5,079,595.

A method including both deposition and patterning is disclosed by K. E. Paul in Appl. Phys. Lett. 2003, Vol 83, p 2070–2072. Patterned organic semiconductor layers are formed by directly printing solution of a semiconductor into the channels of TFTs via an inkjet printer. However, the method requires a specialized semiconductor ink that possesses proper viscosity and stability suitable for printing.

Thus, there is a need for a new process to deposit and pattern organic semiconductor layers in organic electronic devices.

SUMMARY

Aspects disclosed herein include a semiconductor device comprising, a surface on a substrate; and a layer of semiconductor material on the surface, wherein the semiconductor material is patterned by printing solvents;

a method comprising, providing a surface on a substrate; depositing a semiconductor layer on the surface; and depositing a pattern of solvent droplets on the semiconductor layer via printing to pattern the semiconductor layer on the surface;

a method comprising, providing a substrate; forming a layer of semiconductor material on the substrate; and depositing a solvent on the semiconductor layer to pattern the semiconductor layer on the substrate;

a method comprising, a) providing a substrate; b) forming gate, source and drain electrodes; c) forming a gate dielectric layer; d) forming a layer of semiconductor material in contact with the gate dielectric layer and the source and drain electrodes; e) printing one or more solvents on the semiconductor layer to pattern the layer.

DETAILED DESCRIPTION

Figure 1A:
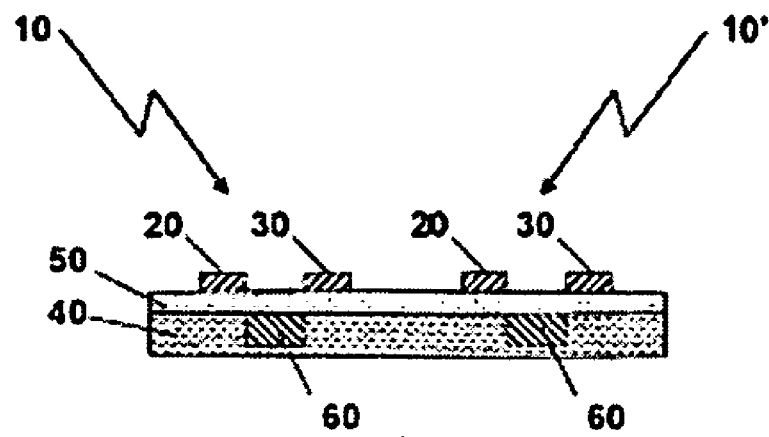
FIGS. 1a–1c is a drawing showing an embodiment of the present invention employing a two-step reverse printing where an organic semiconductor material is first deposited over thin film transistor features without channel semiconductor on a substrate, followed by a second step of patterning the semiconductor layer and where a solvent is used as a printing "ink" agent to form the patterning corresponding to the desired semiconductor patterns.

In embodiments there is illustrated methods for depositing and patterning organic semiconductor layers using a reverse printing method, rather than a direct printing process.

Reverse printing in such methods may provide homogeneity in the film formed over a semiconductor device, thereby enabling the forming of electronic components with better performance properties, and may avoid the problems of printhead blocking that may be encountered in inkjet printing. An aspect of reverse printing involves the printing of a solvent at selective locations on a semiconductor film for forming the desired semiconductor patterns. At the same time, the reverse printing methods may relax otherwise stringent tolerances, thereby making it more cost effective than conventional methods in making organic semiconductor devices.

In one embodiment, the reverse printing method involves patterning a semiconductor layer by employing a solvent as the "ink" which dissolves a semiconductor layer already deposited on a substrate to form the desired patterning corresponding to the features of a thin film transistor on the substrate. The method provides sharper features that improve reliability, and finer lines that increase the density of electronic components that can be formed on semiconductor devices. At the same time, because the space between transistors is usually larger than the channel length of transistors, and that reverse printing can easily accommodate lengths of the order of channel lengths, the method can be used to employ lower printing resolution and less precise registration to yield cost effective means for manufacturing organic semiconductor devices, including active-matrix devices for displays such as electronic paper.

In one embodiment, there is a method for spin coating of a solution or dispersion of the semiconductor materials in a suitable solvent onto a substrate. Other deposition methods such as dip coating, solution casting and bar coating are also included herein for preparation of the organic semiconductor layer. The organic semiconductor layer generally has a thickness from about 5 nanometers to about 1 micrometer, particularly from about 10 nanometers to about 100 nanometers.

The semiconductor in the above method embodiment may first be deposited on partial or entire surface of the substrate where patterning the semiconductor layer into discrete regions is required. After deposition of the semiconductor layer, the layer can be optionally dried before printing of solvent to pattern the layer. The printing can be performed from about room temperature at 20° C. to an elevated temperature of about 150° C. with any suitable printing techniques. Room temperature printing is preferred. The suitable printing techniques include screen or stencil printing, microcontact printing, inkjet printing, and the like.

Most semiconductor material can be used to form a semiconductor layer. In one embodiment, the semiconductor is an organic semiconductor, particularly a soluble organic semiconductor. Exemplary semiconductor materials include regioregular polythiophenes, oligothiophenes, pentacene precursors, and the semiconductor polymers disclosed in Beng Ong et al., US Patent Application Publication No. U.S. 2003/0160230 A1; Beng Ong et al., U.S. Patent Application Publication No. U.S. 2003/0160234 A1; Beng Ong et al., U.S. Patent Application Publication No. U.S. 2003/0136958 A1; and "Organic Thin Film Transistors for Large Area Electronics" by C. D. Dimitrakopoulos and P. R. L. Malenfant, Adv. Mater., Vol. 12, No. 2, pp. 99–117 (2002), the disclosures of which are incorporated herein by reference in their entirety.

The substrate used in the method can be either a "bare" substrate or a substrate already containing layered material (for example, a conductive layer and/or an insulating layer). Accordingly, the surface of the substrate could be a very smooth surface or one which has certain features with large surface roughness. For example, if a bare substrate is used, the surface roughness can be about several angstroms to about 5 nanometers. The substrate of such methods includes plastic, glass, or silicon wafer substrate. The organic semiconductor layer may comprise polythiophene, oligothiophene, pentacene precursors or thiophene-arylene copolymer. The solvent droplets may comprise a solvent which is aliphatic hydrocarbon, aromatic hydrocarbon, alcohol, chlorinated solvent, ketone, ester, ether, amide, amine, sulfone, sulfoxide, carboxylic acid, their derivatives, or mixtures thereof. The solvent droplets may alternatively comprise a solvent which is tetrahydrofuran, heptane, octane, cyclohexane, toluene, xylene, mesitylene, dichloromethane, dichloroethane, chlorobenzene, dichlorobenzene, nitrobenzene, propanols, butanols, pentanols, dimethylsulfoxide, dimethylformamide, alkanecarboxylic acids, arenecarboxylic acids, or mixtures thereof. The dielectric material may comprise silicon oxide, glass, alumina or plastic, and the gate, source and drain electrode materials comprise gold, aluminum, silver, copper, or PEDOT/PSS.

Illustrative classes of solvents that may be used in the above methods include, for example, aliphatic hydrocarbons, aromatic hydrocarbons, alcohols, chlorinated solvents, ketones, esters, ethers, amides, amines, sulfones, sulfoxides, carboxylic acids, their derivatives, and mixtures thereof. Illustrative specific examples of solvents include for example, tetrahydrofuran, heptane, octane, cyclohexane, toluene, xylene, mesitylene, dichloromethane, dichloroethane, chlorobenzene, dichlorobenzene, nitrobenzene, propanols, butanols, pentanols, dimethylsulfoxide, dimethylformamide, alkanecarboxylic acids, arenecarboxylic acids, and mixtures thereof. If more than one solvents is required, they can be printed separately or as a mixture. After printing the solvent onto selective regions on the semiconductor layer, the solvent would dissolve the semiconductor layer locally. The dissolved semiconductor material would then migrate to the undissolved semiconductor regions and solidify thereof, thus creating a "void" in the area where the solvent is printed.

In fabricating TFTs, it is often desirable to have the semiconductor film present only at selected regions of a circuit, or selected regions of an individual device, to achieve, for example, reduced leakage current and crosstalk. Such selective formation, or patterning, also enables the use of different semiconductors in different regions of a device or in different devices of a circuit. However, the organic semiconductor is normally formed as a continuous film covering many devices when conventional deposition techniques such as spin coating and dip coating are used. Therefore, subsequent patterning steps are required to form desired discrete semiconductor layers. It is possible to use established photoresist technology to pattern a deposited organic film. However, known methods such as reactive etching leave unwanted residues and also have the potential danger of degrading the semiconductor film. As an alternative, for some materials it is possible to directly and selectively print, a solution of an organic semiconductor onto a substrate such that a semiconductor film is formed upon evaporation of the solvent. In contrast to this direct printing, reverse printing involves printing a solvent onto a preformed organic semiconductor layer to create "voids" in certain regions on the semiconductor layer, resulting in the patterning of the semiconductor layer.

Figure 1B:
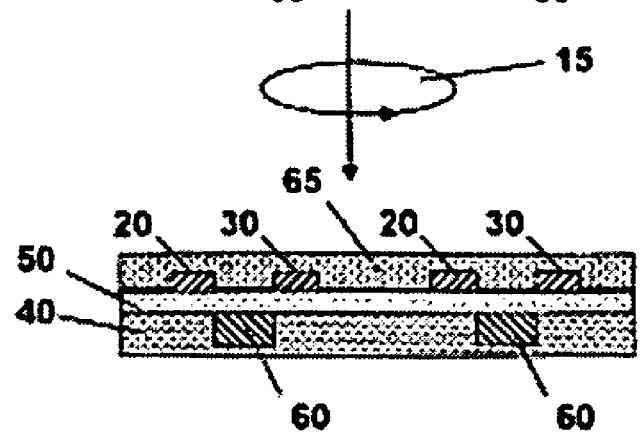
Figure 1C:
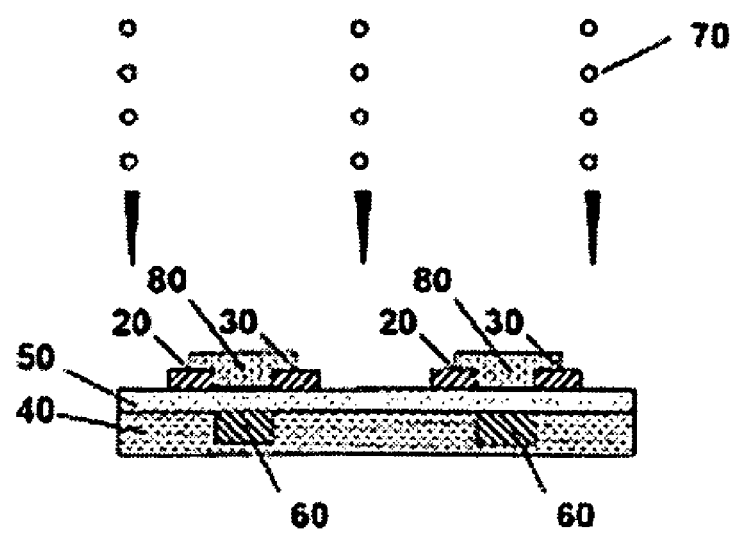

Referring now to the drawings, FIGS. 1a–1c disclose a novel method of forming TFTs using the reverse printing method. The reverse printing is amenable to the roll-to-roll manufacturing line, which is a high throughput manufacturing process.

An embodiment involves the forming of semiconductor materials on a substrate which may or may not have certain preformed transistor features such as electrodes. In FIG. 1a, two TFTs 10 and 10' are shown for illustrative purposes. The TFTs comprising a source electrode 20, a drain electrode 30, and a gate electrode 60 on a substrate 40. The source and the drain electrodes are separated from the gate electrode by an intervening insulating dielectric material 50 as shown in FIG. 1a. Substrate 40 can be conductive, such as silicon, in which case the substrate can serve as a gate electrode. The substrate can also be an insulating material, in which case a gate electrode is formed on the substrate. Suitable insulating materials include silicon oxide, other oxides such as glass and alumina, and polymeric plastic substrates such as polyimide. Typical source, drain and gate electrode materials include metals such as gold, silver, copper, chromium, aluminum, and conductive polymers such as PEDOT/PSS. Dielectric layer 50 over gate 60 can be composed of materials including silicon oxide, spin-on glass, and polyimides. Materials capable of being handled and applied in a roll-to-roll process are also used.

The thin film transistors of FIG. 1a, namely 10 and 10', now are covered by a uniform coating of an organic semiconductor layer 65 shown in FIG. 1b. Layer 65 is formed by spin coating 15, though any number of other known techniques, including dip coating and bar coating, may be used. Following the coating step, the layer is optionally dried, to give a homogenous thin layer covering the dielectric layer 50, and the source electrode 20 and drain electrode 30 as shown in the same FIG. 1b. The organic semiconductor layer 65 in one embodiment is formed by a 1% by weight solution of a semiconductor polymer such as regioregular poly(3-hexythiophene) in toluene.

According to one embodiment, a suitable solvent is printed around each transistor in FIG. 1b to pattern the semiconductor layer 65. The step of printing with solvent is schematically shown as "ink" droplets 70. In one embodiment of the present invention, chlorobenzene was used as the solvent to pattern above semiconductor layer of poly(3-hexythiophene). In another embodiment, the solvent of the ink droplet dissolves the semiconductor material around the thin film transistors 10 and 10'. As a result of the process of reverse printing and subsequent evaporation of the solvent, the dissolved semiconductor material resolidifies from the solution and redeposit at the contact line of the solvent with the semiconductor material after the evaporative drying takes place. Consequently, the solvent printing results in clean and sharp semiconductor features, such as 80 shown in FIG. 1c.

Figure 2:
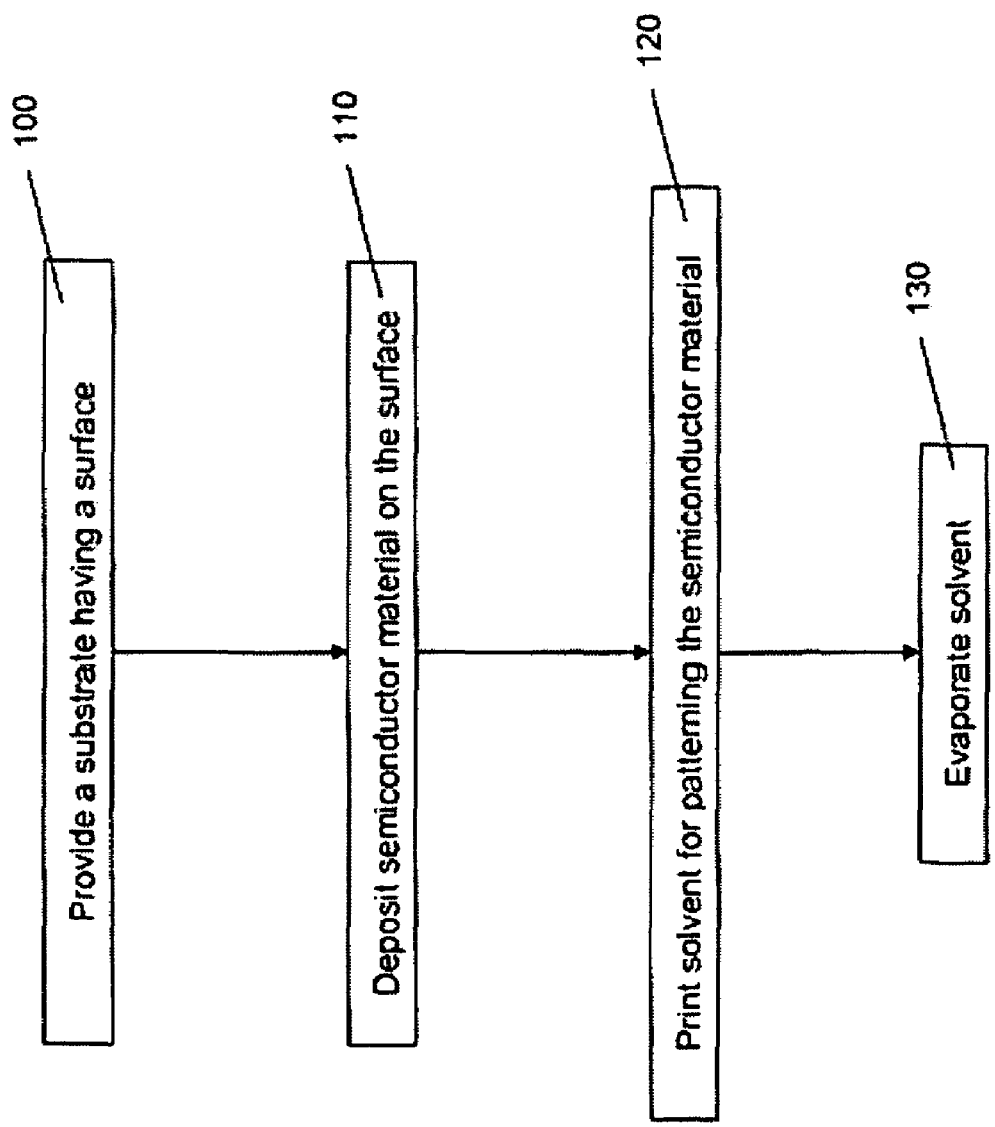
FIG. 2 is a process flow chart showing a two-step method of patterning an organic semiconductor device employing reverse printing, according to an embodiment of the present invention.

The two-step process flow of patterning organic semiconductor layers that may be employed is summarized in FIG. 2. First step 110 involves deposition of an organic semiconductor material onto a substrate 100 having certain preformed TFT features followed by a second step 120 of reverse printing a pattern corresponding to the features on the substrate. Patterning is complete after evaporation of the solvent 130.

Sharper features may improve TFT performance characteristics. On the other hand, because the space between transistors is usually larger than the channel length of transistors, and that reverse printing can easily accommodate lengths of the order of channel lengths, methods of the present invention may be used advantageously to employ lower printing resolution and less precise registration to yield cost effective means for manufacturing organic semiconductor devices, including active matrix circuits for displays, such as electronic paper. Structure and shape of the semiconductor patterns are not limited only to straight edges, but curvilinear, and any other shape used in semiconductor manufacturing are possible. The disclosed methods may be employed in other similar process steps that are too many to cite. For example, reverse printing can be integrated with other methods such as spin or dip coating, vacuum deposition and lift-off patterning to fabricate patterned semiconductor devices which are more cost effective for manufacturing low cost electronic devices.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A reverse inkjet printing method for forming a semiconductor device, comprising:
    providing a surface on a substrate;
    forming one or more transistor elements on the substrate;
    depositing a layer of semiconductor material on the surface of the substrate and transistor elements;
    depositing a pattern of solvent droplets on the semiconductor layer to substantially dissolve portions of the semiconductor material and form a patterned semiconductor layer in accordance with the transistor elements; and
    evaporating the solvent,
    wherein, after the evaporation, portions of the dissolved semiconductor material resolidifies and redeposits at contact lines of the solvent with the semiconductor layer to form sharp patterned semiconductor features.

2. A method in accordance with claim 1, wherein the substrate is plastic, glass, or silicon wafer substrate.

3. A method in accordance with the claim 1, wherein the semiconductor layer is an organic layer of polythiophene, oligothiophene, pentacene precursors or thiophene-arylene copolymer.

4. A method in accordance with claim 1, wherein depositing the semiconductor layer is accomplished by spin coating the semiconductor material.

5. A method in accordance with claim 1, wherein the solvent droplets comprise a solvent which is an aliphatic hydrocarbon, aromatic hydrocarbon, alcohol, chlorinated solvent, ketone, ester, ether, amide, amine, sulfone, sulfoxide, carboxylic acid, their derivatives, or mixtures thereof.

6. A method in accordance with claim 5, wherein the solvent droplets comprise a solvent which is tetrahydrofuran, heptane, octane, cyclohexane, toluene, xylene, mesitylene, dichloromethane, dichloroethane, chlorobenzene, dichlorobenzene, nitrobenzene, propanols, butanols, pentanols, dimethylsulfoxide, dimethylformamide, alkanecarboxylic acids, arenecarboxylic acids, or mixtures thereof.

7. A reverse inkjet printing method for forming a semiconductor device, comprising:
    providing a substrate;
    forming one or more transistor elements on the substrate;
    forming a layer of semiconductor material on the substrate; and
    selectively depositing a solvent on the semiconductor layer to substantially dissolve portions of the semiconductor material and form a patterned semiconductor layer in accordance with the transistor elements; and
    evaporating the solvent,
    wherein, after the evaporation, portions of the dissolved semiconductor material resolidifies and redeposits at contact lines of the solvent with the semiconductor layer to form sharp patterned semiconductor features.

8. A method in accordance with claim 7, wherein the substrate is silicon wafer, glass or plastic substrate.

9. A method in accordance with claim 7, wherein the semiconductor material is polythiophene, oligothiophene, pentacene precursor, or thiophene-arylene copolymers.

10. A method in accordance with claim 7, wherein depositing the semiconductor layer is accomplished by spin coating the semiconductor material.

11. A method in accordance with claim 7, wherein the solvent is tetrahydrofuran, heptane, octane, cyclohexane, toluene, xylene, mesitylene, dichloromethane, dichloroethane, chlorobenzene, dichlorobenzene, nitrobenzene, propanols, butanols, pentanols, dimethylsulfoxide, dimethylformamide, alkanecarboxylic acids, arenecarboxylic acids, or mixtures thereof.

12. A method in accordance with claim 7, wherein the semiconductor layer has a thickness from about 5 nanometers to about 1 micrometer.

13. A reverse inkjet printing method for forming a transistor device, comprising:
   providing a substrate;
   forming gate, source, and drain electrodes;
   forming a gate dielectric layer;
   forming a layer of semiconductor material in contact with the gate dielectric layer and the source and drain electrodes; and
   selectively depositing one or more solvents on the semiconductor layer to substantially dissolve portions of the semiconductor material and form a patterned semiconductor layer in accordance with the source and drain electrodes; and
   evaporating the solvent,
   wherein, after the evaporation, portions of the dissolved semiconductor material resolidifies and redeposits at contact lines of the solvent with the semiconductor material to form sharp patterned semiconductor features.

14. A method in accordance with claim 13, wherein the substrate is silicon wafer, glass or plastic substrate.

15. A method in accordance with claim 13, wherein the dielectric material is silicon oxide, glass, alumina or plastic, and the gate, source and drain electrode materials comprise gold, aluminum, silver, copper, or PEDOT/PSS.

16. A method in accordance with claim 13, wherein forming the semiconductor layer is accomplished by spin coating an organic semiconductor solution.

17. A method in accordance with claim 13, wherein the semiconductor is polythiophene, oligothiophene, pentacene precursor, or thiophene-arylene copolymer.

18. A method in accordance with claim 13, wherein the one or more solvents is tetrahydrofuran, heptane, octane, cyclohexane, toluene, xylene, mesitylene, dichloromethane, dichloroethane, chlorobenzene, dichlorobenzene, nitrobenzene, propanols, butanols, pentanols, dimethylsulfoxide, dimethylformamide, alkanecarboxylic acids, arenecarboxylic acids, or mixtures thereof.

* * * * *

UNITED STATES PATENT AND TRADEMARK OFFICE
CERTIFICATE OF CORRECTION

PATENT NO. : 7,105,375 B2
APPLICATION NO. : 10/909081
DATED : September 12, 2006
INVENTOR(S) : Yiliang Wu et al.

Page 1 of 1

It is certified that error appears in the above-identified patent and that said Letters Patent is hereby corrected as shown below:

In the Specification:

Column 1, lines 7 and 8 after "Cooperative Agreement No.", please delete "70NANBOH3033" and insert --70NANB0H3033--.

Signed and Sealed this
Third Day of September, 2013

Teresa Stanek Rea
*Acting Director of the United States Patent and Trademark Office*